(12) United States Patent
Voski

(10) Patent No.: US 11,927,497 B2
(45) Date of Patent: Mar. 12, 2024

(54) POLLUTION AND TORQUE MEASURING DEVICE FOR BUSBAR ADDITIONAL CONNECTION MODULES

(71) Applicant: EAE ELEKTRIK ASANSOR ENDUSTRISI INSAAT SANAYI VE TICARET ANONIM SIRKETI, Istanbul (TR)

(72) Inventor: Vedat Voski, Istanbul (TR)

( * ) Notice: Subject to any disclaimer, the term of this patent is extended or adjusted under 35 U.S.C. 154(b) by 505 days.

(21) Appl. No.: 17/286,886

(22) PCT Filed: Aug. 10, 2020

(86) PCT No.: PCT/TR2020/050698
§ 371 (c)(1),
(2) Date: Apr. 20, 2021

(87) PCT Pub. No.: WO2021/029844
PCT Pub. Date: Feb. 18, 2021

(65) Prior Publication Data
US 2021/0381916 A1     Dec. 9, 2021

(30) Foreign Application Priority Data
Aug. 15, 2019 (TR) ................. 2019/12274

(51) Int. Cl.
G01L 5/24     (2006.01)
G01R 27/02    (2006.01)
H02G 5/00     (2006.01)

(52) U.S. Cl.
CPC ............ *G01L 5/24* (2013.01); *G01R 27/02* (2013.01); *H02G 5/007* (2013.01)

(58) Field of Classification Search
CPC .......... G01L 5/24; G01R 27/02; H02G 5/007
USPC ...................................... 73/862.08
See application file for complete search history.

(56) References Cited

U.S. PATENT DOCUMENTS 7,704,083 B1 * 4/2010 Cheyne ............... H01R 25/162
439/115
2016/0064836 A1 * 3/2016 Nishikawa ............ H01R 3/08
174/68.2

FOREIGN PATENT DOCUMENTS

| CN | 107453307 A | 12/2017 |
|---|---|---|
| CN | 109217151 A | 1/2019 |
| EP | 2412065 B1 | 3/2016 |
| JP | 2012169244 A * | 9/2012 |
| KR | 20170001197 A | 1/2017 |

OTHER PUBLICATIONS

Translation of JP-2012169244-A (Year: 2012).*
International Search Report and Written Opinion of the International Searching Authority for corresponding PCT/ TR2020/050698, dated Feb. 18, 2021.

* cited by examiner

*Primary Examiner* — Nathaniel T Woodward
(74) *Attorney, Agent, or Firm* — Egbert, McDaniel & Swartz, PLLC

(57) ABSTRACT

Disclosed is a pollution and torque measuring device for busbar additional connection modules that detects the degree of pollution occurring in the additional connection modules that allow busbar modules to be attached to each other in electrical distribution systems known as busbars and whether the additional is tightened with sufficient torque.

20 Claims, 3 Drawing Sheets

POLLUTION AND TORQUE MEASURING DEVICE FOR BUSBAR ADDITIONAL CONNECTION MODULES

TECHNICAL FIELD

The invention relates to a pollution and torque measuring device for busbar additional connection modules.

In particular, the invention relates to a pollution and torque measuring device for busbar additional connection modules that detects the degree of pollution occurring in the additional connection modules that allow busbar modules to be attached to each other in electrical distribution systems known as busbars and whether the additional is tightened with sufficient torque.

BACKGROUND OF THE INVENTION

In today's energy distribution systems, modular compact conductors called busbar are used. Each conductor called busbar is more preferred because it has structures with a high current carrying capacity.

Electrical distribution and transport systems known as busbar are modular. Each busbar module is attached to the end of the line according to the route of the electrical line and forms the electric transport line. The modules are connected to each other by means of the so-called additional module.

The busbar add-on module connects the conductor rods in the busbar modules electrically and mechanically to each other and allows the line to continue.

In busbar electrical distribution systems, it is of great importance to check the mounting accuracy of the additional module that allows busbar modules to be attached to each other.

After the said additional connection module joins the two busbar modules, its assembly is completed by tightening it with the help of a bolt. If the said bolt is not tightened at sufficient torque, loosening and thus energy transmission loss occurs over time.

In the current system, there is no system that checks the accuracy of the said assembly process. During the first assembly, the amount of torque to be tightened is determined and tightened at that torque amount. However, over time there may be loosening of the bolt. It is also not easy to detect.

Another additional connection module problem is related to the detection of dust and contamination that may occur on the additional connection module.

Problems occurring in both of the aforementioned cases result in overheating of the additional connection module. However, as mentioned, this is a conclusion and energy was lost due to heating.

In the current system, temperature sensors are used to detect this temperature increase on the additional connection module. These sensors detect the increase in temperature and warn the user.

However, as a risk, the temperature sensors cannot do what is desired due to the system not being heated sufficiently before and during commissioning, so the system cannot be controlled well. In other words, the said heat sensors are not able to detect when the problem begins to occur, that is, when contamination or loosening begins. As a consequence of the problem, it began to detect when warming occurred, and that moment is too late for return.

In the literature, Korean patent application No. KR20170001197 also relates to the subject matter "The present invention relates to an apparatus to monitor a temperature of a switchboard capable of preventing fire by detecting a temperature of a connection unit or a busbar in the switchboard in real time. The apparatus to monitor the temperature of the switchboard comprises: a PT resistance signal detecting unit outputting a PT resistance value detected by a PT100 ohm sensor by including a Wheatstone bridge circuit as a predetermined level voltage signal; an amplification unit amplifying a voltage signal output from the PT resistance detection unit several times, outputting the voltage signal by receiving the voltage signal; a non-contact temperature sensor signal detecting unit converting a temperature value detected by the non-contact temperature sensor into a predetermined level voltage signal, and outputting the signal; a processing unit receiving the voltage signal outputted from the amplification unit and the non-contact temperature sensor signal detecting unit, converting the voltage signal into a digital number; a data transmission unit transmitting the digital number data converted by the processing unit to a predetermined external device; a data transmission unit transmitting the digital number data converted by the processing unit to the predetermined external device; and an input and output control unit performing input to the processing unit by setting an exclusive identification address of the corresponding device and the speed of communication, and outputting the number generated by the output signal of the processing unit through an FND."

In the said application, a busbar system that measures the busbar temperature using heat sensors is disclosed.

In the literature, European patent application No. EP2412065B1 also relates to the subject matter "A busbar connector comprising: first and second, each portion includes: first and second rigid members forming an outer portion of the busbar connector; a transmission element that forms an interior of the busbar connector; and a compliant element having a stiffness less than the first and second rigid elements and a first surface connected to the first and second rigid elements and a second surface opposite the first surface connected to the transmission element; and between and in contact with the transmission elements of the first and second parts to allow flow of current between the first and second busbar by applying a force from the outer part of the busbar connector to the inner part of the busbar connector on each of the first and second rigid elements in substantially central parts of the first and second rigid elements. relates to a first fastener structure and a second fastener structure configured to secure a first busbar and a second busbar."

In the said application, an additional connection module mounting assembly that connects the busbars together is disclosed.

For the reasons mentioned above, a new pollution and torque measuring device was needed for busbar additional connection modules.

OBJECT OF THE INVENTION

From this position of the art, the object of the invention is to provide a new pollution and torque measurement device for busbar additional connection module which eliminates the present disadvantages.

Another object of the invention is to provide a structure that provides the mounting accuracy control of the additional connection module that allows the busbar modules to be interconnected.

Another object of the invention is to present a structure that may arise from not being assembled well and preventing all kinds of problems due to dust while waiting in its environment.

Another object of the invention is to provide a structure that determines whether the attachment is tightened with sufficient torque, the assembly of the product is completed and whether there is a problem in the attachment while the product is in operation.

Another object of the invention is to provide a structure that enables detection in order to prevent contamination and dusting that may occur in busbar additional connection modules before the heating starts.

Another object of the invention is to establish a structure that prevents energy losses by detecting the loosening of the bolts of the busbar additional connection modules over time.

Another object of the invention is to create a structure that prevents possible fires by preventing overheating of the busbar additional connection modules.

Another object of the invention is to detect the dirt or loosening of the busbar additional connection modules at the first stage and to provide a structure that prevents the additional connection module from being damaged.

REFERENCE NUMBERS

A—The Pollution And Torque Measuring Device
1. Busbar Additional Connection Modules
   1.1 Neutral Conductor
   1.2 L1 Conductor
   1.3 L2 Conductor
   1.4 L3 Conductor
   1.5 Ground Body
   1.6 Left Measuring Point
   1.7 Right Measuring Point
2. Contact Apparatus Group
   2.1 Left Contact Apparatus Group
   2.2 Right Contact Apparatus Group
3. Contact Apparatus Cover
   3.1 Contact Slot
4. Electronic Card
5. Outer Cover
   5.1 Electronic Card Slot

DETAILED DESCRIPTION OF THE INVENTION

In this detailed description, the innovation subject to the invention is explained only with examples that do not have any limiting effect for a better understanding of the subject.

The invention relates to a pollution and torque measuring device (A) for busbar additional connection modules (1) that detects the degree of pollution occurring in the additional connection modules (1) that allow busbar modules to be attached to each other in electrical distribution systems known as busbars and whether the additional is tightened with sufficient torque characterized in that; comprises the contact apparatus group (2) that performs the function of measuring individual resistance values from the left and right sides of the mentioned busbar additional connection module (1), electronic card (4) that detects the difference and warns the user if the resistance values on the left and right sides of the busbar additional connection module (1) are different.

Figure 1:
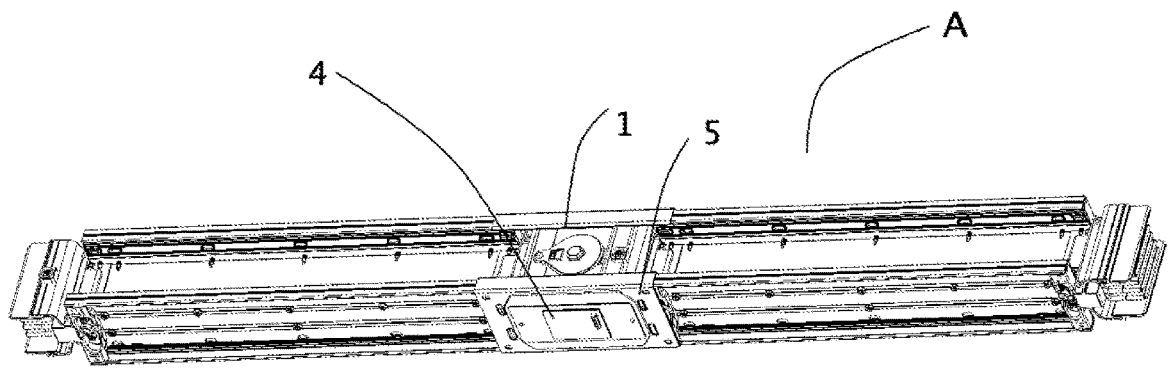
FIG. 1 A perspective view of the pollution and torque measuring device for busbar additional connection modules, which is the subject of the invention.

FIG. 1 shows a perspective view of the pollution and torque measuring device (A) for busbar additional connection modules (1), which is the subject of the invention.

Figure 2:
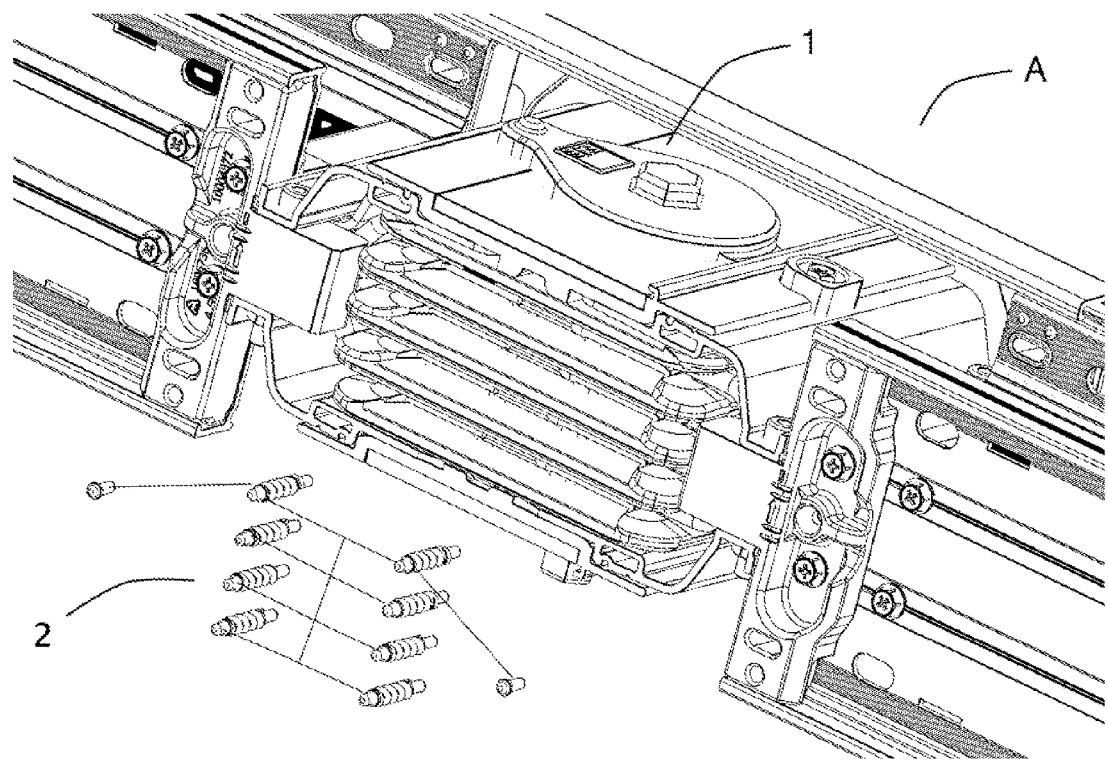
FIG. 2 A detailed perspective view of the pollution and torque measuring device for busbar additional connection modules which is the subject of the invention.

FIG. 2 shows a detailed perspective view of the pollution and torque measuring device (A) for busbar additional connection modules (1) which is the subject of the invention.

Figure 3:
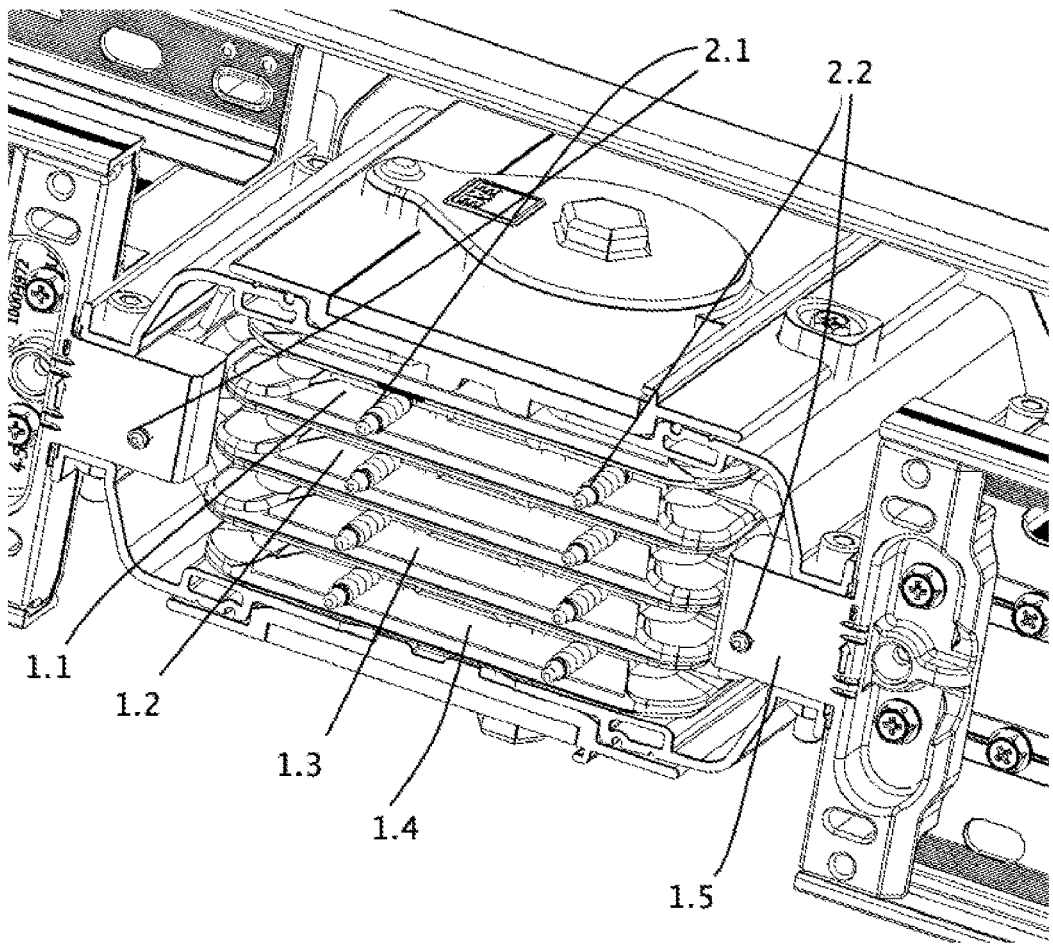
FIG. 3 Another detailed perspective view of the pollution and torque measuring device for busbar additional connection modules which is the subject of the invention.

FIG. 3 shows another detailed perspective view of the pollution and torque measuring device (A) for busbar additional connection modules (1) which is the subject of the invention.

Figure 4:
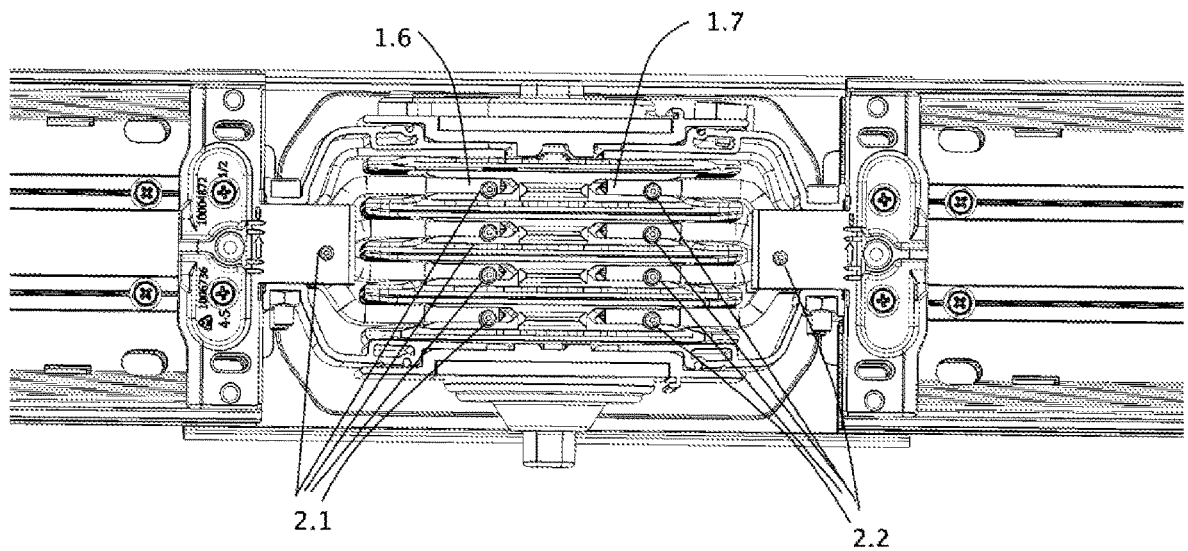
FIG. 4 Side detail view of the pollution and torque measuring device for busbar additional connection modules which is the subject of the invention FIG. 5 A disassembled perspective view of the pollution and torque measuring device for busbar additional connection modules which is the subject of the invention.

FIG. 4 shows side detail view of the pollution and torque measuring device (A) for busbar additional connection modules (1) which is the subject of the invention.

Figure 5:
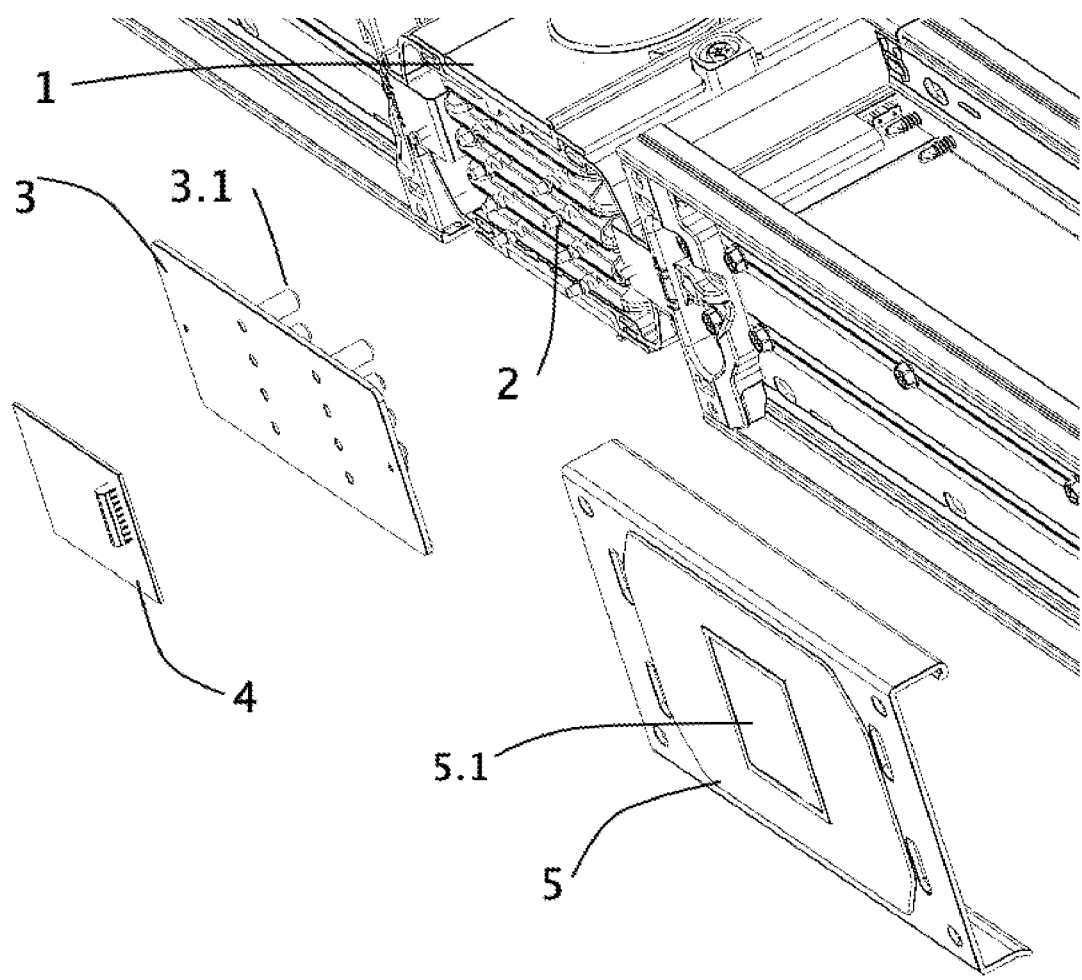

FIG. 5 shows a disassembled perspective view of the pollution and torque measuring device (A) for busbar additional connection modules (1) which is the subject of the invention.

The pollution and torque measuring device (A) for busbar additional connection modules (1) according to invention consist main parts of; busbar additional connection module (1), which performs the function of connecting two busbar modules mechanically and electrically, consisting of neutral conductor (1.1), L1 conductor (1.2), L2 conductor (1.3), L3 conductor (1.4) and ground body (1.5), the contact apparatus group (2) that performs the function of measuring individual resistance values from the left and right sides of the mentioned busbar additional connection module (1), the left contact apparatus group (2.1) that makes the resistance value measurement from the left side of the said additional connection module (1) and forms a part of the said contact apparatus group (2), right contact apparatus group (2.2), which measures resistance value from the right side of said additional connection module, forming another part of said contact apparatus group (2), the left measuring point (1.6) which is the place where the said left contact apparatus group (2.1) measures and located on the L1 conductor (1.2), L2 conductor (1.3), L3 conductor (1.4), neutral conductor (1.1) and the ground body (1.5) on the said additional connection module (1), the right measuring point (1.7) which is the place where the said right contact apparatus group (2.2) measures and located on the L1 conductor (1.2), L2 conductor (1.3), L3 conductor (1.4), neutral conductor (1.1) and the ground body (1.5) on the said additional connection module (1), electronic card (4) that detects the difference and warns the user if the resistance values on the left and right sides of the busbar additional connection module (1) are different, contact apparatus cover (3) that helps measurement by contacting said contact apparatus group (2) on said additional connection module (1), contact slot (3.1) located on said contact apparatus cover (3), where said left contact apparatus group (2.1) and right contact apparatus group (2.2) are located, the outer cover (5) which is positioned outside the said contact apparatus cover (3) and prevents voluntary or involuntary external contacts and the electronic card slot (5.1) formed on the said outer cover (5) and housing the said electronic card (4).

In the application of the pollution and torque measuring device (A) for the busbar additional connection module (1), which is the subject of the invention, the user makes the resistance measurement from the left measuring point (1.6) which is located separately on L1 conductor (1.2), L2 conductor (1.3), L3 conductor (1.4) and the ground body (1.5) which are the parts of the busbar additional connection module (1). For this measurement process, the left contact apparatus group (2.1) constituting a part of the contact apparatus group (2) is used. The resistance values measured here are transmitted to the electronic card (4).

Then, the user, the user makes the resistance measurement from the right measuring point (1.7) which is located separately on L1 conductor (1.2), L2 conductor (1.3), L3 conductor (1.4) and the ground body (1.5) which are the parts of the busbar additional connection module (1). For this measurement process, it uses the right contact apparatus group (2.1), which forms another part of the contact apparatus group (2). The resistance values measured here are also transmitted to the electronic card (4).

If the left measurement point (1.6) and right measurement point (1.7) resistance values are different, the electronic card (4) detects this difference and warns the user that there is contamination or that it is not tightened with sufficient torque.

In a preferred embodiment of the invention, the said contact apparatus group (2) is permanently located on the said busbar additional connection module (1).

In another preferred embodiment, the said contact apparatus group (2) makes measurements at any time in a removable and pluggable structure via a contact apparatus cover (3).

The contacts that form the contact apparatus group (2) are spring contacts.

In the preferred application of the invention, after assembly, the busbar conductors for test purposes are fed (phase-neutral supply) and the resistance values are measured at the left measurement point (1.6) and the right measurement point (1.7) of the busbar additional connection module (1).

In another application, the required current for measurement can be supplied with the energy supply received by the said electronic card (4).

In another embodiment, an internal battery is positioned in the electronic card (4) for the said feeding process.

In another preferred application of the invention, the said electronic card (4) is in a structure that can be installed later by authorized personnel and removed after use.

The invention claimed is:

1. A pollution and torque measuring device for busbar additional connection modules, the pollution and torque measuring device for detecting a degree of pollution occurring in the busbar additional connection modules, the busbar additional connection modules to be connected to each other, the pollution and torque measuring device comprising:
    a contact apparatus group adapted to measure individual resistance values from a left side and a right side of the busbar additional connection modules; and
    an electronic card that detects a difference in the measured individual resistance values and warns a user if the detected measured individual resistance values are different.

2. The pollution and torque measuring device of claim 1, wherein said contact apparatus group comprises:
    a left contact apparatus group that measures a resistance value from the left side of the busbar additional connection modules.

3. The pollution and torque measuring device of claim 2, wherein said contact apparatus group further comprising:
    a right contact apparatus group that measures a resistance value from the right side of the busbar additional connection modules.

4. The pollution and torque measuring device of claim 3, wherein said left contact apparatus group comprises a left measure point located on the busbar additional connection modules.

5. The pollution and torque measuring device of claim 4, wherein said right contact apparatus group comprises at right measuring point located on the busbar additional connection modules.

6. The pollution and torque measuring device of claim 5, wherein the right measuring point is located on an L2 conductor.

7. The pollution and torque measuring device of claim 5, wherein the right measuring point is located on an L3 conductor.

8. The pollution and torque measuring device of claim 5, wherein the right measuring point is located on a neutral conductor.

9. The pollution and torque measuring device of claim 5, wherein the right measuring point is located on a ground body.

10. The pollution and torque measuring device of claim 4, wherein the left measuring point is located on an L1 conductor.

11. The pollution and torque measuring device of claim 4, wherein the left measuring point is located on an L2 conductor.

12. The pollution and torque measuring device of claim 4, wherein the left measuring point is located on an L3 conductor.

13. The pollution and torque measuring device of claim 4, wherein the left measuring point is located on a neutral conductor.

14. The pollution and torque measuring device of claim 4, wherein the left measuring point is located on a ground body.

15. The pollution and torque measuring device of claim 1, wherein the right measuring point is located on an L1 conductor.

16. The pollution and torque measuring device of claim 1, further comprising:
    a contact apparatus cover that contacts said contact apparatus group on the busbar additional connection modules.

17. The pollution and torque measuring device of claim 16, wherein a contact slot is located on said contact apparatus cover.

18. The pollution and torque measuring device of claim 16, further comprising:
    an outer cover positioned exterior of said contact apparatus cover.

19. The pollution and torque measuring device of claim 18, wherein an electronic card slot is formed on said outer cover, the electronic card slot housing and electronic card.

20. The pollution and torque measuring device of claim 1, wherein said contact apparatus group has a spring contact.

* * * * *